United States Patent
Luo et al.

(10) Patent No.: US 7,635,843 B1
(45) Date of Patent: Dec. 22, 2009

(54) IN-LINE RELIABILITY TEST USING E-BEAM SCAN

(75) Inventors: Yuhao Luo, San Jose, CA (US); Jonathan Cheang-Whang Chang, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 374 days.

(21) Appl. No.: 11/827,730

(22) Filed: Jul. 13, 2007

(51) Int. Cl.
*G01N 23/00* (2006.01)
(52) U.S. Cl. .................. 250/307; 250/310; 324/751; 324/752; 324/753
(58) Field of Classification Search .......... 250/307, 250/306, 310; 324/751, 752, 753, 759, 537
See application file for complete search history.

(56) References Cited

U.S. PATENT DOCUMENTS 6,445,199 B1    9/2002    Satya et al.
6,891,610 B2 *  5/2005    Nikoonahad et al. ..... 356/237.2

OTHER PUBLICATIONS

Shimada, Akihiro et al., "Loop Before You Yield", Accelerating Killer Defect Detection in the FEOL, winter 2005, p. 33-37, web pages; www.kla-tencor.com/magazine.

* cited by examiner

*Primary Examiner*—Kiet T Nguyen
(74) *Attorney, Agent, or Firm*—Scott Hewett; Michael R. Hardaway

(57) ABSTRACT

A method of testing a semiconductor wafer having a test structure performs an E-beam stress scan of the test structure in an E-beam system to electrically stress the test structure to produce a stress defect. An inspection scan is performed in the E-beam system to identify the stress defect.

20 Claims, 7 Drawing Sheets

IN-LINE RELIABILITY TEST USING E-BEAM SCAN

FIELD OF THE INVENTION

The present invention relates generally to semiconductor devices, and more particularly to electrical stress testing of metal-oxide-semiconductor ("MOS") devices.

BACKGROUND OF THE INVENTION

Programmable logic devices (PLDs) are a well-known type of integrated circuit ("IC") that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") field-effect transistor ("FET") (e.g., a P-type MOS ("PMOS") FET) paired with a second-conductivity-type MOS transistor (e.g., an N-type MOS ("NMOS") FET). CMOS cells can hold a logic state while drawing only very small amounts of current.

The integrity of the gate dielectric ("gate oxide") is important for holding a logic state. Defects in the gate oxide can provide current leakage paths that corrupt the logic state stored by the MOS FET. Such defects are often called "soft defects". In some cases, defects in the gate oxide or other structures can cause a short circuit or open circuit between terminals of the device that destroys operability of the FET. Such defects are often called "killer defects".

Some defects in the FET are observable. Electron-beam ("E-beam") inspection techniques are typically used to inspect process wafers during a fabrication sequence for gate oxide and other defects. Such inspection is commonly referred to as "in-line" because the inspection step is incorporated into the fabrication process flow. In other words, process wafers can be inspected between fabrication steps without removing the wafer from the fabrication area, such as between front-end-of-line ("FEOL") processes and back-end-of-line ("BEOL") processes.

Some defects appear only after electrical stress is applied to the device. Defects arising from such stress tests are typically done off-line. That is, the wafer is removed from the fabrication sequence for stress testing. Techniques have been developed testing IC wafers that incorporate structures specifically designed to accelerate killer defects. Such structures are known for both accelerating and capturing defects occurring in the FEOL and in the BEOL. Generally, the scanning beam of an E-beam inspection system enhances contrast between good portions and defective portions of a test structure. An example of a technique for defect detection in the FEOL is described in *Loop Before You Yield*, by Akihiro Shimada et al., KLA-Tencor Yield Management Solutions, Winter 2005, the disclosure of which is hereby incorporated by reference in its entirety for all purposes. Techniques for identifying defects of a semiconductor test structure in the BEOL processes are described in U.S. Pat. No. 6,445,199 B1, issued Sep. 3, 2002 to Satya et al., the disclosure of which is hereby incorporated by reference in its entirely for all purposes.

However, these techniques only detect processing (intrinsic) defects. In order to detect stress-related (also called extrinsic or reliability) defects, such as oxide reliability, electrical stress needs to be applied to the device. Techniques for in-line detection of extrinsic (stress) defects are desirable to provide improved processing feedback and improved device reliability.

SUMMARY OF THE INVENTION

A method of testing a semiconductor wafer having a test structure performs an E-beam stress scan of the test structure in an E-beam system to electrically stress the test structure to produce a stress defect. An inspection scan is performed in the E-beam system to identify the stress defect. Embodiments of the invention use test structures to induce stress defects arising in FEOL structures or in BEOL structures. Various types of tests structures are optionally included, and multiple stress scans are optionally applied by changing one or more parameters, such as flux, voltage, temperature, or scan rate, of the stress scan. Various embodiments of the invention are optionally used repeatedly during the fabrication sequence of a wafer. In other words, a first embodiment is used for FEOL structures, and a second embodiment for BEOL structures.

DETAILED DESCRIPTION

Figure 1:
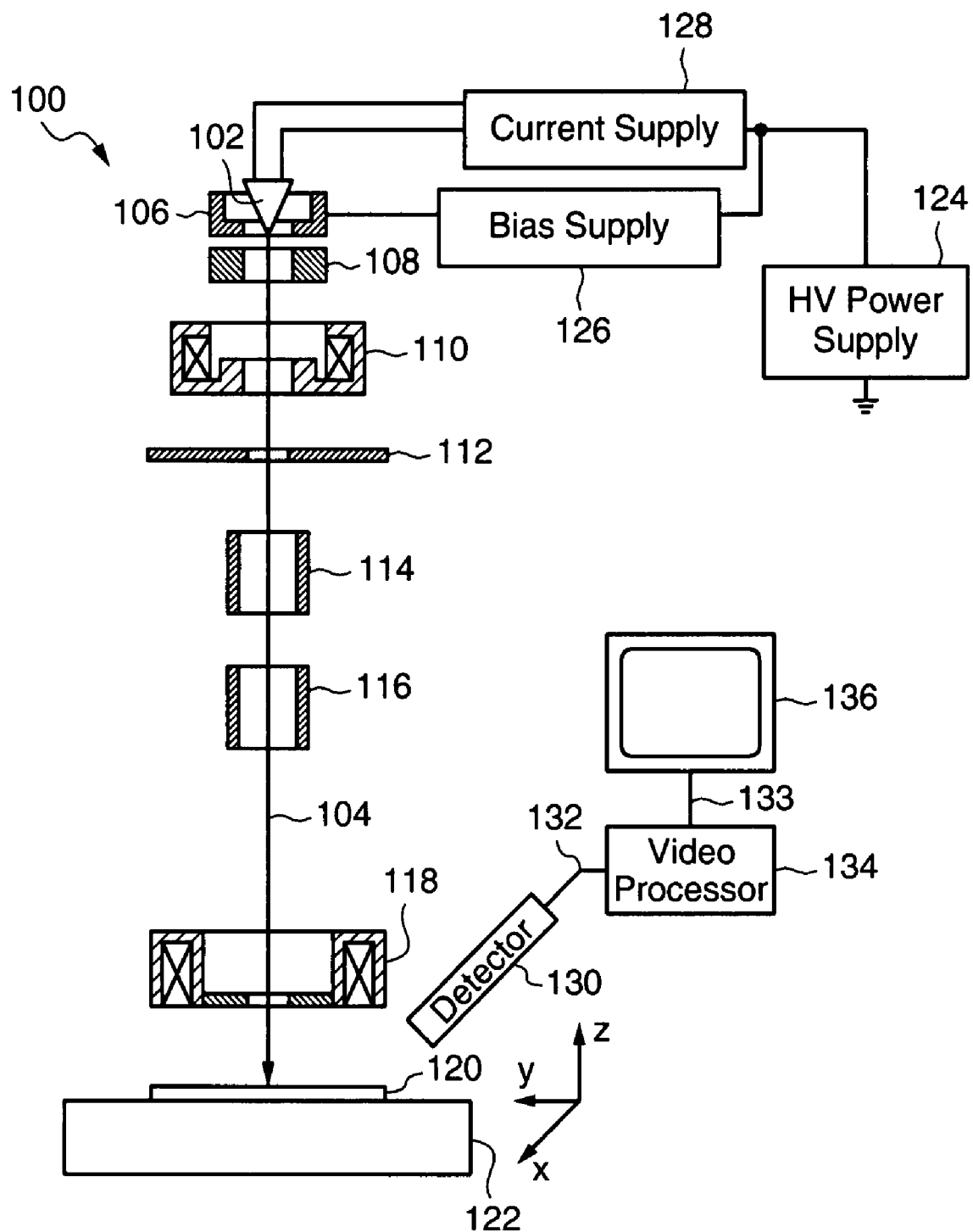
FIG. 1 is a diagram of an exemplary E-beam system, in accordance with an embodiment of the present invention.

FIG. 1 is a diagram of an exemplary E-beam system 100. E-beam systems are well known in the art of IC inspection; therefore, a detailed description of the components and operation of an E-beam are omitted. Those of skill in the art appreciate that FIG. 1 and its associated description are simplified. The E-beam system has an electron gun with a cathode 102 that produces an electron beam 104. The electron beam passes through an emission control electrode 106, an anode 108, a condenser lens 110, an aperture 112, deflectors 114, 116 and an objective lens 118 to a sample 120, such as an IC wafer or an IC chip. The sample 120 is supported by a stage 122. The stage 122 is typically movable in at least the X and Y directions.

A high-voltage ("HV") power supply 124 is typically kept at a constant voltage (e.g., 10-20 KeV) and a bias supply 126 connected to the emission control electrode 106 controls the energy of electrons emitted by the cathode 102 at the sample 120. A current supply 128 connected to the cathode 102 controls the numbers of electrons (flux) being emitted. The deflectors 114, 116 move the electron beam 104 across a selected area of the sample 120 according to any of several well known scanning techniques. An E-beam control unit (not shown) connected to the elements of the E-beam system controls parameters such as flux, E-beam energy, and scanning rate, as well as focus and in some systems, automatic movement of the stage 122.

Electrons emitted from the sample are commonly known as secondary electrons. These secondary electrons are detected by a detector 130 that produces an electrical signal 132 that is converted to a video signal 133 by a video processor 134. A display 136 shows an image of the area of the sample 120 being inspected. Alternative embodiments use other post-detection techniques, such as digitizing the electrical signal or video signal.

The sample 120 is a manufacturing wafer that includes circuit devices (i.e., devices such as FETs, floating-gate memory cells, and MOS capacitors used in an integrated circuit defined on the manufacturing wafer) and at least one test structure (see, e.g., FIG. 3A) according to an embodiment of the invention. In an alternative embodiment, the sample is a test wafer that includes several test structures and may or may not include circuit devices.

Insulating regions or floating conductive regions of the sample being scanned become charged when the number of secondary electrons leaving the area (structure) does not equal the number of electrons arriving in the incident electron beam ("primary electrons"). Conductive regions that are grounded or connected to a selected potential (e.g., to second bias supply, not shown) provide a current path for primary electrons. The charge balance of a structure depends on its material, topology, and current path(s), if any. These differences between structures of the sample provide contrast between the structures in the image obtained by the E-beam system.

When inspecting a manufacturing wafer, it is undesirable to damage circuit devices. In a conventional E-beam inspection technique, parameters of the E-beam, such as scan rate, flux, and electron energy are kept low. Embodiments use an E-beam stress scan ("stress scan") to electrically charge test structures on a sample, such as a semiconductor wafer, to induce electrical stress damage.

The stress scan is performed at different conditions, such as higher flux, higher electron energy, slower scan rate, or high wafer temperature, selected to induce stress defects in the test structure. Inspection scans are performed before and after the stress scan to identify stress damage. The inspection scan(s) are performed over at least the test structure(s) and optionally over circuit devices. If the semiconductor wafer is a test wafer, the entire wafer is optionally scanned with the stress scan. In a further embodiment, stepped stress test is performed by stressing a test structure or wafer at a first stress level, then inspecting the wafer and stressing the test structure or wafer at a second stress level, and re-inspecting the wafer. The second stress level is a higher level of the type of stress used for the first stress test (e.g., higher voltage), or alternatively is a different type of stress (e.g., higher temperature).

Figure 2:
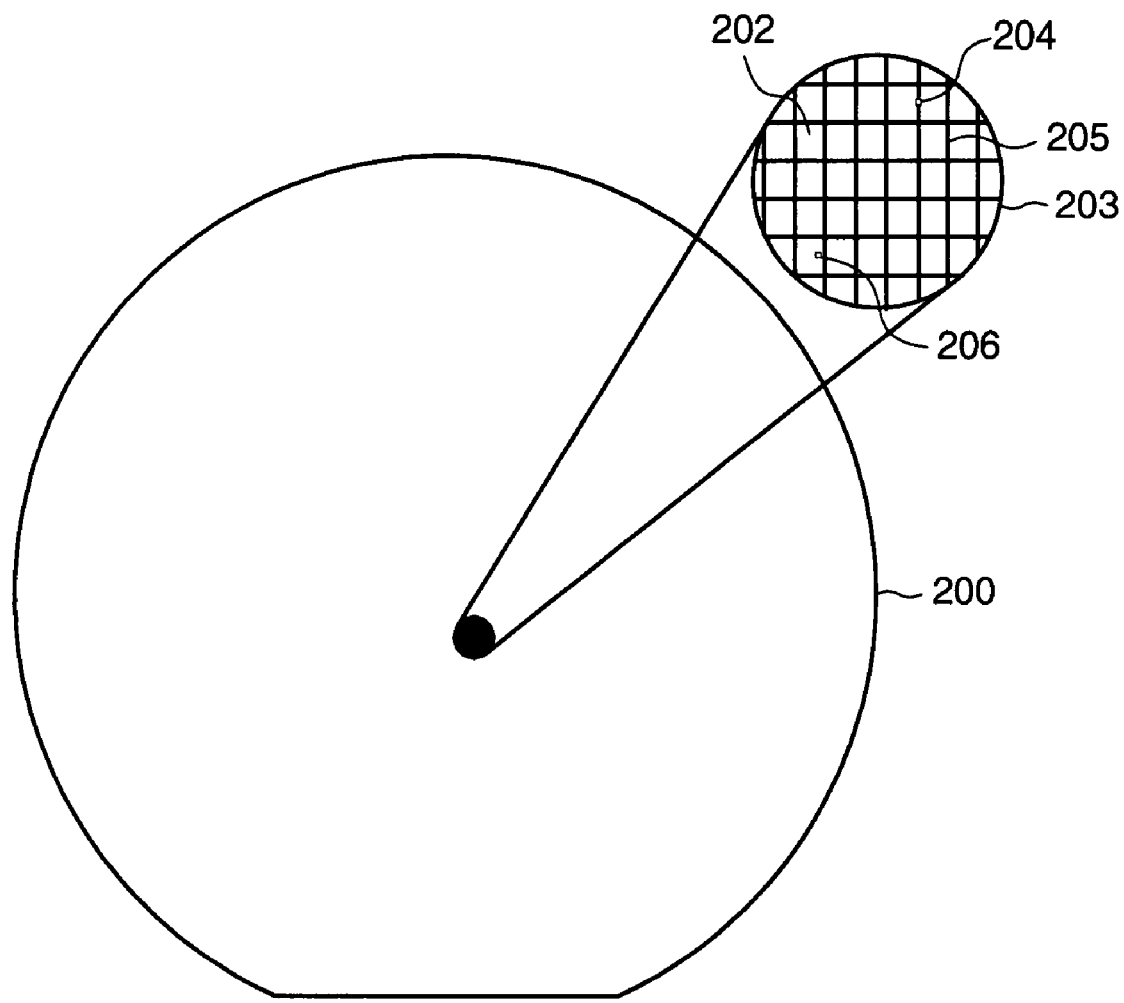
FIG. 2 is a plan view of a wafer for use, in accordance with an embodiment of the present invention.

FIG. 2 is a plan view of a wafer 200 suitable for use in an embodiment. The wafer 200 is a manufacturing wafer having a plurality of ICs 202 shown in a magnified window 203. The wafer 200 is laid out in a rectangular grid, which in some embodiments us a square grid. After fabrication of the ICs is complete, IC chips are singularized from the wafer along alleys 205 by sawing or scribing and breaking.

The wafer 200 includes test structures 204, 206 designed to indicate electrical stress defects after a stress scan in an E-beam system. Alternatively, test structures are incorporated into one or more ICs. The stress scan is limited to the test structures 204, 206. The test structure can be anywhere on the wafer. For example, the test structure 204 is within the alley 205 and test structure 206 is included in an IC. Alternatively, the wafer is a test wafer that is not intended to produce shippable ICs, but is designed to evaluate process conditions and layout dimensions. In that case, the stress scan can be applied to other areas in addition to the test structures 204, 206.

Figure 3A:
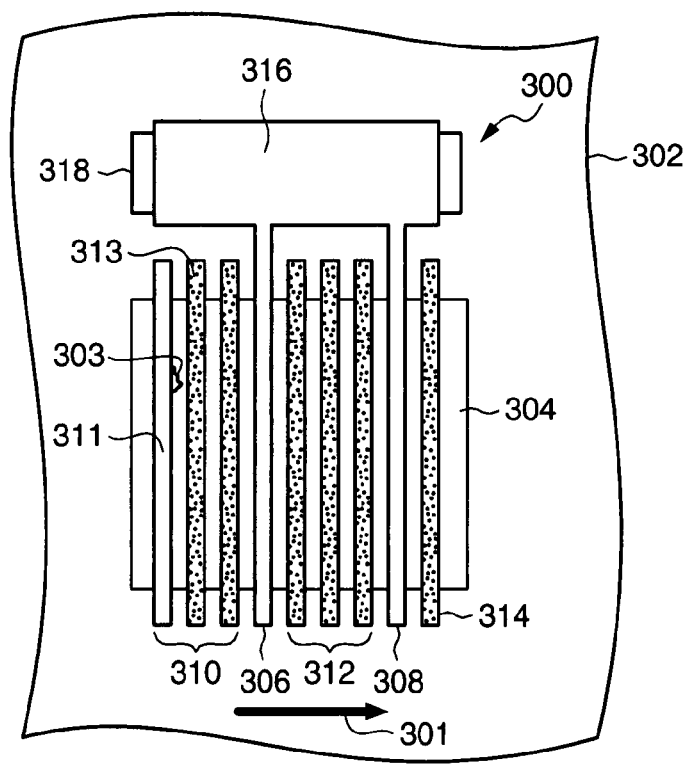
FIG. 3A is plan view of a test structure according to an embodiment of the invention during a first E-beam inspection scan.

FIG. 3A is plan view of a test structure 300 according to an embodiment of the invention during a first E-beam inspection scan. An arrow 301 extending from left to right indicates the scan direction of the E-beam. The first E-beam scan ("first inspection scan") is performed with parameters (e.g., temperature, voltage, flux, and scan speed) optimized to identify damaged areas, such as oxide breakdown, of the test structure 300. The test structure is fabricated on a wafer 302, such as a silicon wafer. An active area 304 of the wafer 302, such as N+ doped regions of a P-type silicon wafer, underlie quasi-grounded polysilicon 306, 308 and floating polysilicon 310, 312, 314. The floating polysilicon is shown with stippling (fill) to represent that it will appear differently, such as have a different contrast value, than the quasi-grounded polysilicon when viewed during an E-beam scan inspection.

The quasi-grounded polysilicon 306, 308 is connected to a capacitor 316 that has a very large capacitance compared to the capacitance of the quasi-grounded polysilicon overlying the active area 304. The capacitor, which in a particular embodiment is also polysilicon, capacitively couples to a second active area 318, providing a "quasi-ground" for the quasi-grounded polysilicon 306, 308. A gate dielectric layer is between the quasi-grounded polysilicon, the floating polysilicon and the active area 304, and is between the capacitor 316 and the active area 318.

The capacitor provides a charge sink that draws charge off the quasi-grounded polysilicon 306, 308 as the device is scanned with the E-beam. Charge builds up on the floating polysilicon 310, 312, 314, which will appear lighter or darker than the quasi-grounded polysilicon 306, 308, depending on the viewing conditions of the E-beam inspection system and scanning parameters, as described in previously incorporated *Loop Before You Yield*, by Akihiro Shimada et al., KLA-Tencor Yield Management Solutions, Winter 2005.

An intrinsic defect, such as an intrinsic defect 303 in the oxide that provides a current path between a polysilicon element 311 to the active area will cause that polysilicon element 311 to appear lighter than a floating polysilicon element 313 that is electrically isolated from the active area. The polysilicon element 311 may appear darker or lighter than the quasi-grounded polysilicon, depending on the type of intrinsic defect, scan conditions, or other factors. The first E-beam scan, or E-beam pre-stress inspection scan, is a relatively low-voltage scan performed to detect intrinsic defects in the test structure 300.

Many types of intrinsic defects, such as opens or shorts in the active areas, opens or shorts in the polysilicon, or gate oxide defects, such as current leakage between the polysilicon and active area, can be detected. In alternative embodiments that include contacts and patterned metal layers, additional types of defects can be identified.

Figure 3B:
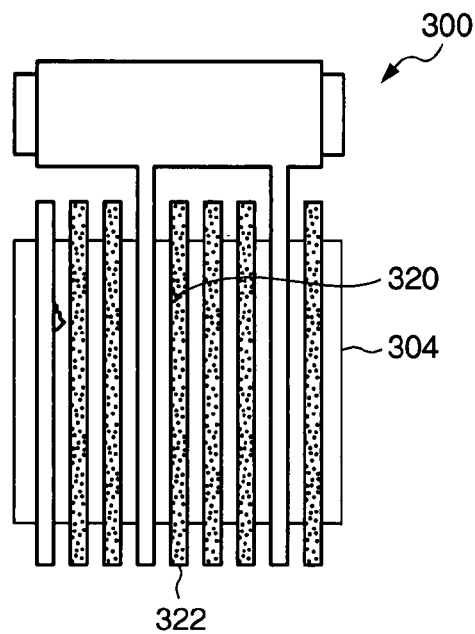
FIG. 3B is a plan view of the test structure of FIG. 1A after an E-beam stress scan according to an embodiment of the invention.

FIG. 3B is a plan view of the test structure 300 of FIG. 3A after E-beam stress scan according to an embodiment of the invention. A second E-beam scan, or E-beam stress scan, is applied to the test structure 300. The second E-beam scan is a high-voltage scan that stresses the gate oxide, for example, to induce oxide breakdown. Various parameters of the E-beam stress scan, such as voltage and scan speed, wafer temperature, are optimized to produce the desired electrical stress in the test structure. In a particular embodiment, the E-beam pre-stress inspection scan is at lower voltage and room temperature (25 degrees Celsius), and the second scan is at a higher voltage (about 2 times to 5 times higher than the voltage used in the first scan) and higher temperature (85 degrees Celsius to about 200 degrees Celsius).

The second E-beam scan electrically stresses the test structure by charging the floating polysilicon or other conductive material to a voltage level sufficient to induce damage 320 in the gate oxide (not shown) between the floating poly 322 and the active area 304. In a particular embodiment, the gate oxide at the damage site 320 has reduced dielectric strength, and the voltage built up on the polysilicon 322 by the second E-beam scan causes dielectric breakdown to occur in the gate oxide.

The damage 320 occurs in a weak portion of the test structure, such as a BEOL IMD/ILD breakdown or device breakdown (punch-though).

Figure 3C:
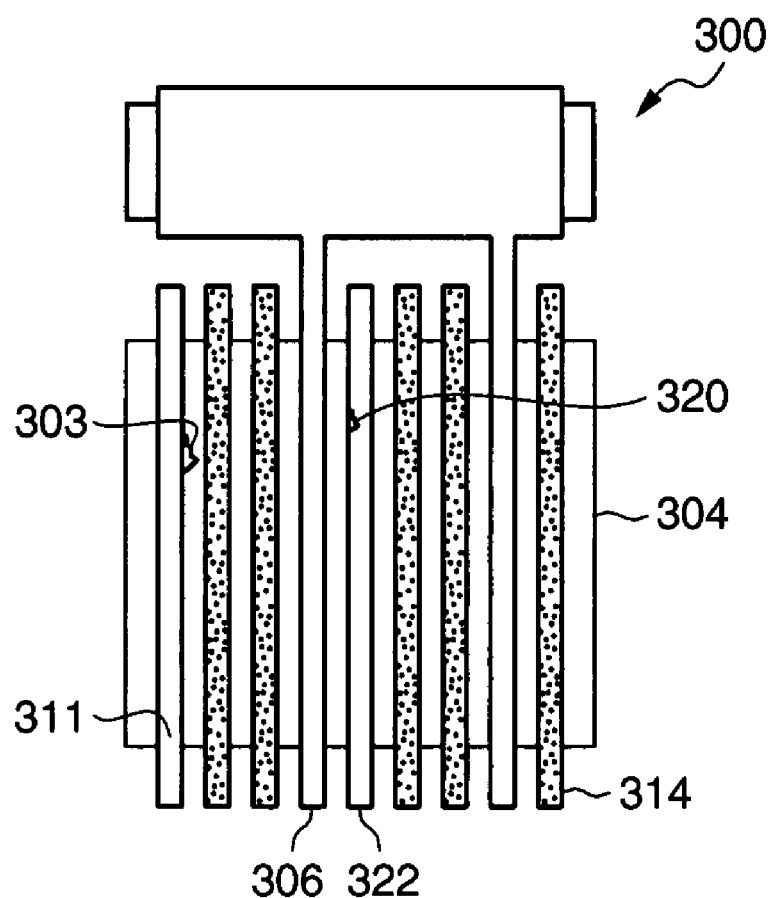
FIG. 3C is a plan view of the test structure of FIG. 1B during a second E-beam inspection scan, in accordance with an embodiment of the present invention.

FIG. 3C is a plan view of the test structure of FIG. 3B during an E-beam post-stress inspection scan. The post-stress inspection scan, the third E-beam scan, is substantially similar to the first E-beam scan in that the third E-beam scan parameters are optimized for inspecting the test structure 300 for stress damage. In some embodiments the parameters of the third scan are essentially the same as for the first scan. The damage 320 induced by electrical stress of the second E-beam scan provides a current path between the polysilicon 322 that was formerly floating (compare FIG. 3A, ref. num. 312) and the active area 304. Instead of charging the polysilicon 322 to have contrast similar to the floating polysilicon 314, charge flows to the active area 304, and the polysilicon 322 has contrast more similar to the quasi-grounded polysilicon 306, although it may be lighter or darker than the quasi-grounded polysilicon. Both hard and soft defect are detectable, depending on the sensitivity of the system and test structure. The polysilicon element 311 that appears lighter than the floating polysilicon elements was identified in the pre-stress inspection (see FIG. 3A), which indicates that the defect 303 is an intrinsic defect and was not caused by the stress step.

Various manufacturing problems might cause a defect or weak spots, such as scratches in the silicon, contamination, surface imperfections in the oxide, oxide damage during following process, such as poly etch, S/D etch, or silicide spiking. This method can be used for both extrinsic defect (weak spot) and intrinsic weakness, especially during new process/materials development, such as high-k or ultra-low-k BEOL.

The pre-stress and post-stress inspection scans are compared to identify stress damage in the test structure induced by the stress scan. Although no intrinsic defects were identified in the example of FIG. 3A, intrinsic defects are identified in alternative test structures during the first E-beam scan, and stress defects are identified during the third E-beam scan, as in the example of FIG. 3C. In some cases, intrinsic defects might also be identified in the third E-beam scan, but are easily distinguished from stress defects by comparing the third E-beam scan to the first E-beam scan.

Using the second E-beam scan to induce stress damage to the test structure provides an in-line reliability test for FEOL. Alternative embodiments use similar E-beam stress techniques for in-line reliability test of BEOL. These techniques allow a process wafer to remain in an E-beam inspection station during intrinsic defect inspection, electrical stressing, and inspection for stress damage defects. After stressing the wafer, it may be further processed. Conventional stress testing is performed off-line on wafers after BEOL processing. In-line stress (reliability) testing of the gate oxide provides quick process feedback for the gate oxide/polysilicon fabrication.

Figure 3D:
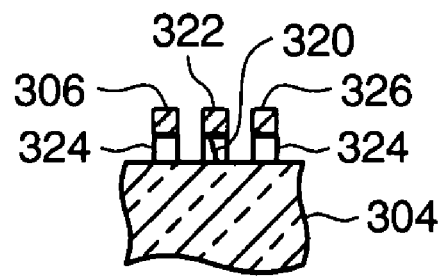
FIG. 3D is a cross section of a portion of the test structure shown in FIG. 3C, in accordance with an embodiment of the present invention.

FIG. 3D is a cross section of a portion of the test structure shown in FIG. 3C. Floating polysilicon element ("finger") 326 and quasi-grounded polysilicon element 306 are separated from the active area 304 by a gate dielectric layer 324. The stress defect 320 in the gate dielectric layer provides a current path from polysilicon element 322 to the active area, which acts as a charge source or sink, so that charge does not accumulate on the polysilicon element 322 to the same extent that charge accumulates on the floating polysilicon element 326. The polysilicon element 322 in the third scan (second inspection scan) appears differently in relation to polysilicon element 326 than in the first scan.

Figure 3E:
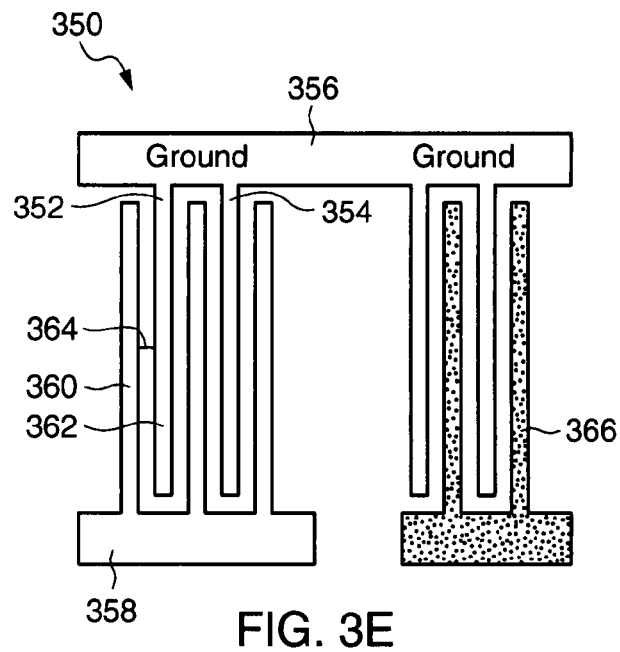
FIG. 3E is a plan view of a test structure for BEOL testing according to an embodiment.

FIG. 3E is a plan view of a test structure 350 for BEOL testing according to an embodiment. Fingers 352, 354 extend from a ground bus 356, that it, a conductive element that is held at ground potential or otherwise provides a current sink or source. Fingers 360, 362 extend from a floating bus 358 and are interdigitated with the fingers 352, 354 from the first bus 356. The fingers and busses are defined in a pattern metal layer, such as a damascene or dual damascene layer. Generally, voids, such as trenches, are formed in a layer of inter-metal dielectric ("IMD") and filled with metal. It is desirable to insure the quality of the IMD; that is, that the IMD does not break down as a result of electrical stress between two metal structures (e.g., fingers).

An E-beam stress scan charges the floating bus 358 and fingers 360, 362 relative to the grounded metal 352, 354, and 356. The floating bus is alternatively omitted; however, the floating bus provides greater surface area for charge accumulation during the E-beam stress scan and electrically ties many floating fingers together, so that a short on any finger provides a current path for the other fingers on the bus, which enhances visual identification of affected fingers.

A stress defect 364 in the IMD between fingers 352 and 360 provides a current path from the floating metal to the grounded metal, which causes the appearance (e.g., contrast) of the fingers 360, 362 to more closely look like the grounded finger 352. A floating finger 366 that is not connected to the grounded metal through a defect causing a current path appears distinctly different from the grounded finger 322. Depending on scan conditions, the fingers 360, 362 electrically connected to the current sink by the defect 364 may appear substantially the same as grounded finger 352, or intermediate between grounded finger 352 and floating finger 366.

Figure 3F:
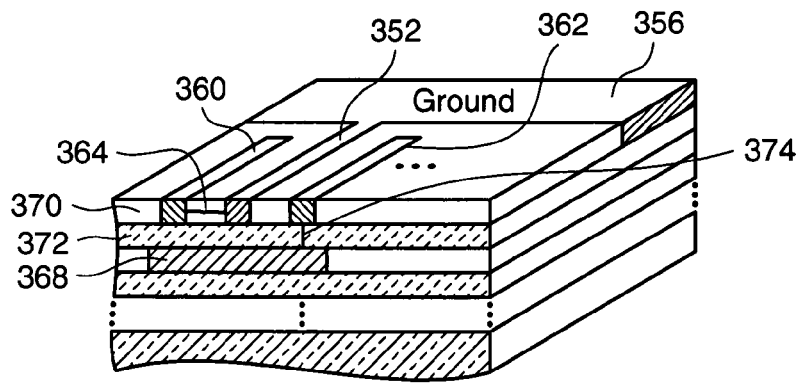
FIG. 3F is an isometric cross section of a portion of the BEOL test structure of FIG. 3E and also showing a second test structure for BEOL testing according to another embodiment.

FIG. 3F is an isometric cross section of a portion of the BEOL test structure 350 of FIG. 3E and also showing a second test structure for BEOL testing according to another embodiment. The defect 364 shown in FIG. 3E occurs in the IMD layer 370. A metal structure 368 is formed in a metal layer underneath the floating fingers 360, 362. An inter-layer dielectric ("ILD") layer separates the upper metal layer from the lower metal layer. A defect 374 in the ILD 372 shorts the finger 362 to the metal structure 368.

Omitting the second bus 358 shown in FIG. 3E so that floating fingers 360, 362 were not electrically connected to each other avoid the charge accumulated on finger 362 from flowing to ground through the IMD defect 364. However, the combined test structures of FIG. 3F may be used to test both IMD and ILD layers by alternately grounding first the bus 356 and then the metal structure 368, or vice versa. A via or other electrical path (not shown) allows the user to apply a potential, such as ground, to the metal structure 368.

In an exemplary application, the bus 356 is grounded and the metal structure 368 is allowed to float. A first E-beam stress scan is applied to induce stress defects in the IMD. Then, the bus 356 is allowed to float and the metal structure 368 is grounded. A second E-beam stress scan is applied to induce stress defects in the ILD. During inspection, a first inspection scan is performed with the bus 356 grounded and the metal structure 368 floating, and then a second scan is performed with the metal structure 368 grounded and the bus 356 floating. The order of these steps is not essential, and several variations exist. Alternatively, a single stress scan with both the bus 356 and metal structure 368 grounded is performed, or a single inspection scan with both the bus 356 and metal structure 368 grounded is performed.

Figure 3G:
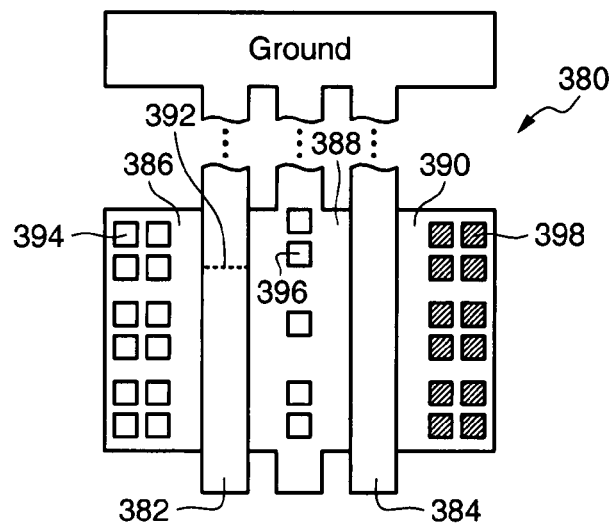
FIG. 3G is a plan view of a test structure for testing channel breakdown according to another embodiment.

FIG. 3G is a plan view of a test structure 380 for testing channel breakdown according to another embodiment. The test structure has two gate structures 382, 384 (e.g., polysilicon or silicide) overlying a gate dielectric layer (not shown) on a semiconductor substrate. Channel regions, are formed under the gate structures, as are well known in the art of MOS devices.

Diffusions 386, 388, 390 are formed in the substrate, similar to source/drain ("S/D") diffusions used for fabricating FETs. Thus, the test structure 380 is similar to two FETs sharing a common source/drain diffusion 388. The gate structures 382, 384 and the diffusion 388 are connected to a common potential, such as ground, which turns the channel regions OFF. An E-beam scan applied to the test structure 380 charges up the diffusion areas 386, 390 relative to the diffusion area 388, creating electrical stress that can induce breakdown in the channel region. The defect 392 is shown as a dotted line because it occurs in the channel region beneath the gate structure 382. The channel breakdown defect 392 provides a current path between diffusions 386 and 388. Contacts 394, 396, 398 are optionally provided to facilitate inspection or to subject the channel to additional wafer processing steps. The contact 394 appears more similar to contact 396 than contact 398 does, thus indicating a defect between diffusions 386 and 388.

Many other types of test structures are suitable for use in embodiments. For example, a single FET-like test structure is alternatively used, or a single gate is used with two floating diffusions on one side of the gate and a grounded diffusion on the opposite side.

Figure 4:
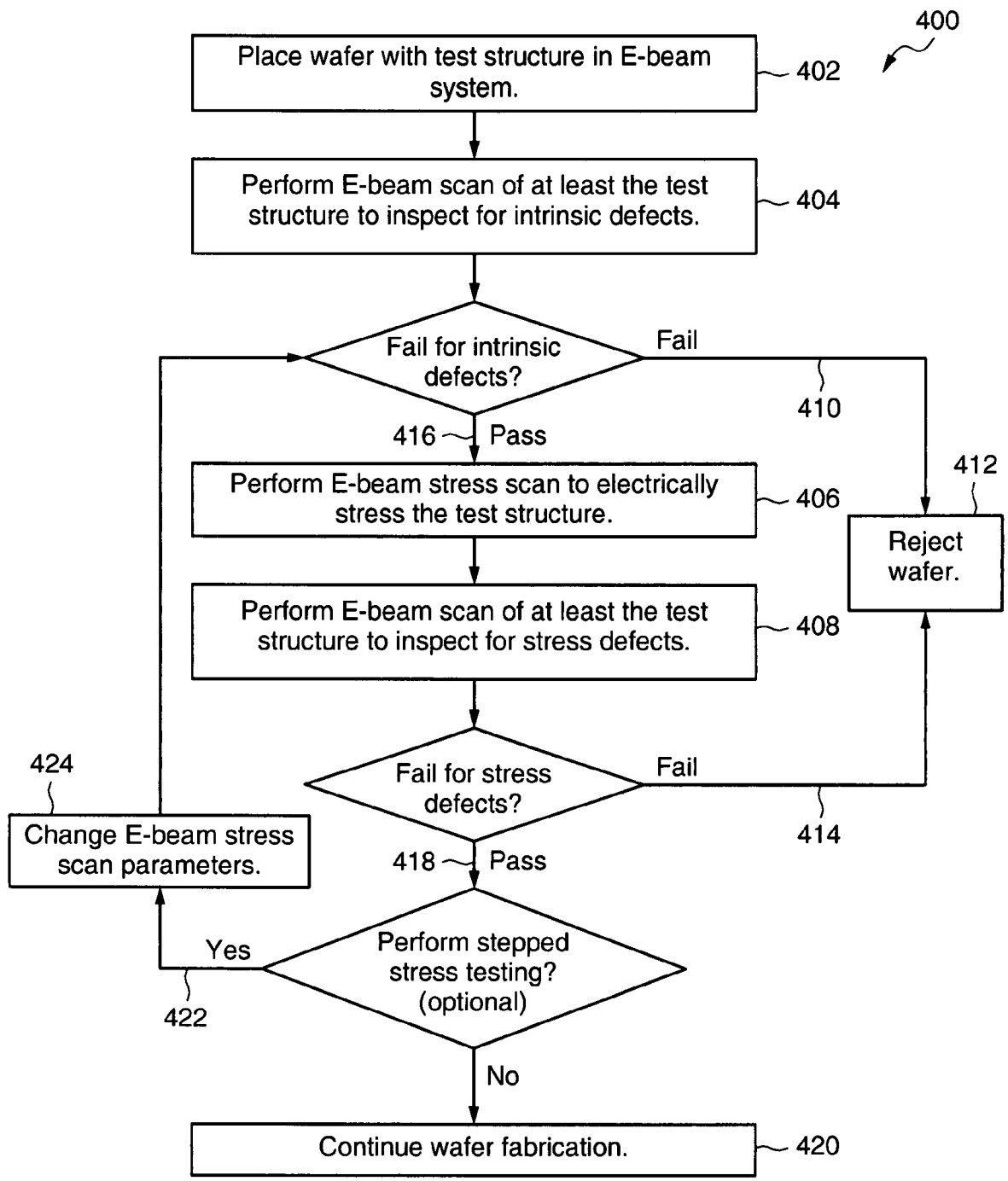
FIG. 4 is a flow chart of a method of testing IC wafers 200 according to an embodiment of the invention.

FIG. 4 is a flow chart of a method of testing IC wafers 400 according to an embodiment of the invention. A semiconductor wafer having a test structure is placed in an E-beam system (step 402) and a first E-beam scan is performed to identify first defects (step 404). In one embodiment, the first E-beam scan is optimized to identify intrinsic defects of the test structure. Then, a second E-beam scan is performed in the E-beam system on the semiconductor wafer to create electrical stress for accelerating stress defects in the test structure and preferably not in FETs of the IC (step 406). In another embodiment, the test structure is a polysilicon test structure defined on a gate oxide layer, at least portions of the polysilicon test structure overlying an active area of the semiconductor wafer, and the electrical stress created by the second E-beam induces failures of defects in the gate oxide. This method can be used to check device punch-through as well, which is caused by short poly CD, silicide pipe, spacer narrowing, etc. Source side can be grounded and apply voltage to the drain side to stress the device.

After the second E-beam scan, a third E-beam scan of the stressed semiconductor wafer is performed to identify second defects (step 408) caused by the electrical stress of the second E-beam scan by comparing the third E-beam scan to the first E-beam scan. Alternatively, the first inspection scan is skipped; however, an intrinsic defect might be more difficult to distinguish from a stress-induced defect in such an embodiment. The first inspection scan might be skipped if very few intrinsic defects exist, if the intrinsic defects do not alter the appearance of the test structure, or if the intrinsic defects are easily distinguished from stress-induced defects by inspection. In a particular embodiment, the third E-beam scan is optimized to identify the second defects, and in a further embodiment, the third E-beam scan is substantially similar to the first E-beam scan. In some embodiments the third E-beam scan also identifies the intrinsic defects seen in the first scan.

In a further embodiment, if the wafer fails the scan for intrinsic defects (branch 410) the wafer is rejected (step 412) and not processed further. In a yet further, if the wafer fails for stress defects (branch 414), the wafer is rejected (step 412). In an alternative embodiment, the wafer is stress scanned and evaluated for stress defects whether or not the wafer failed for intrinsic defects. In a particular embodiment, the wafer is a test wafer that is not intended to produce production ICs. If the wafer is a production (manufacturing) wafer, and the wafer passes both intrinsic defects (branch 416) and stress defects (branch 418), the wafer is further processed (step 420) to produce ICs. In a particular embodiment, the scans for intrinsic defect detection and stress defection are performed during FEOL processing or between FEOL processing and BEOL processing. In and alternative embodiment, the scans are performed during BEOL processing. In some embodiments, some areas of a manufacturing wafer may be restricted (i.e., ICs from these areas are rejected) according to the intrinsic defect and stress defect test results.

In a further embodiment, another stress/inspect sequence is performed (branch 422) so that multiple types of test structures are evaluated, such as similar poly patterns on each of three different oxide thickness, or a test structure is evaluated at a different condition or increased condition from the first stress scan. The parameters of the E-beam stress scan, such as sample temperature, current flux, electron beam voltage, or scan rate, are changed (step 424), and the stress scan and inspection scan steps are repeated.

Alternatively, the first inspection scan is omitted and intrinsic defects are identified by the inspection scan performed after the stress scan. For example, the appearance of intrinsic defects is quite distinct from the appearance of the stress defects in some cases, thus an inspection scan prior to the stress scan is not essential.

Figure 5:
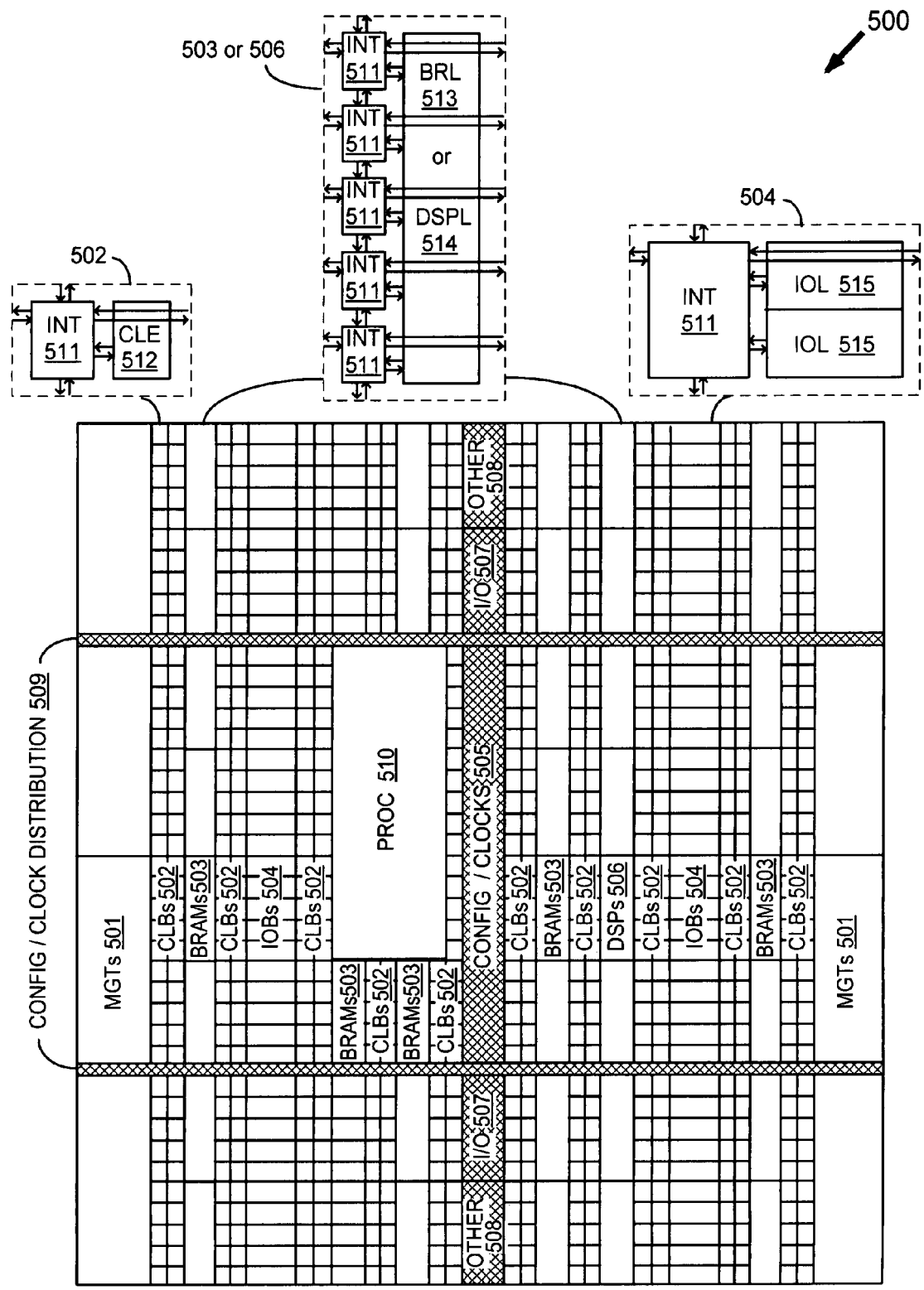
FIG. 5 is a diagram of an integrated circuit according to an embodiment of the invention.

FIG. 5 is a plan view of an integrated circuit 500 according to an embodiment of the invention. The integrated circuit is an FPGA that includes CMOS portions in several of the functional blocks, such as in RAM and logic, and is fabricated using a CMOS fabrication process. Silicon-based gate oxide layers according to one or more embodiments of the invention are incorporated in any of several functional blocks, such as a memory block, logic block, I/O block, clock circuit, transceiver, or other functional block; within many functional blocks; or within a physical section or segment of the FPGA 500.

The FPGA 500 includes test structures 555, 557 for stress testing structures of the FPGA or a partially fabricated FPGA on a wafer in an E-beam system using an E-beam scan to charge portions of the test structures. Alternatively, test structures (not shown) are provided in alleys or other portions of a wafer so as to not consume area of the finished ICs. In some embodiments, the test structures include polysilicon or other conductive material electrically separated from a current path (i.e., floating) by a gate dielectric layer. In alternative or additional embodiments, test structures including floating conductive elements are formed in patterned metal layers and separated from a current path by an IMD layer. Embodiments can also be used to check device punch-through, which is caused by short poly CD, silicide pipe, or spacer narrowing. For example, the source side can be grounded and voltage applied to the drain side of a test structure to stress the test device.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown crosshatched in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, other types of structures or reliability failure mechanisms can be tested using E-beam voltages. Therefore, the spirit and scope of the appended claims should not be limited to the foregoing description.

What is claimed is:

1. A method of testing a semiconductor wafer having a test structure comprising:

placing the semiconductor wafer in an electron-beam ("E-beam") system;

performing an E-beam stress scan of at least the test structure to electrically stress the test structure to produce a stress defect in the test structure; and performing an E-beam post-stress inspection scan of the test structure in the E-beam system to identify the stress defect.

2. The method of claim 1 further comprising a step, after placing the semiconductor wafer in the E-beam system and before performing the E-beam stress scan, of performing an E-beam pre-stress inspection scan to identify an intrinsic defect of the semiconductor wafer.

3. The method of claim 2 further comprising a step of comparing the E-beam pre-stress inspection scan with the E-beam post-stress inspection scan.

4. The method of claim 2 wherein the E-beam post-stress scan further identifies an intrinsic defect and the stress defects are identified by comparing the E-beam pre-stress inspection scan and the E-beam post-stress inspection scan.

5. The method of claim 1 wherein the E-beam post-stress inspection scan further identifies an intrinsic defect.

6. The method of claim 1 wherein the test structure includes floating polysilicon structures and quasi-grounded polysilicon structures each separated from a semiconductor substrate by a gate dielectric layer.

7. The method of claim 6 wherein the E-beam stress scan induces breakdown of extrinsic defects in the gate dielectric layer.

8. The method of claim 1 wherein the test structure includes a floating metal structure and a grounded metal structure, the floating metal structure being separated from the grounded metal structure by an inter-metal dielectric.

9. The method of claim 1 wherein the test structure includes a floating metal structure and a grounded metal structure, the floating metal structure being separated from the grounded metal structure by an inter-layer dielectric.

10. The method of claim 1 wherein the E-beam stress scan is performed at a voltage at least twice the voltage of the E-beam pre-stress inspection scan.

11. The method of claim 1 wherein the E-beam stress scan is performed at a voltage at least twice the voltage of the E-beam post-stress inspection scan.

12. The method of claim 1 wherein the E-beam stress scan is performed at a wafer temperature higher than the wafer temperature of the E-beam pre-stress inspection scan.

13. The method of claim 1 wherein the E-beam stress scan is performed at a wafer temperature higher than the wafer temperature of the E-beam post-stress inspection scan.

14. The method of claim 1 wherein the semiconductor wafer includes partially processed field-programmable gate arrays ("FPGA").

15. The method of claim 14 wherein the E-beam pre-stress inspection scan is performed over at least one partially processed FPGA.

16. The method of claim 14 wherein the E-beam post-stress inspection scan is performed over at least one partially processed FPGA.

17. The method of claim 14 wherein the E-beam stress scan is performed over at least one partially processed FPGA.

18. The method of claim 1 wherein the test structure is defined in an alley of the semiconductor wafer.

19. The method of claim 1 wherein the semiconductor wafer further has a second test structure and the E-beam stress scan is performed under first stress scan conditions, and further comprising:
  performing a second E-beam stress scan under second stress scan conditions to electrically stress at least the second test structure to produce a second stress defect in the second stress structure.

20. The method of claim 19 wherein the step of performing the second E-beam stress scan occurs after performing the E-beam inspection scan.

* * * * *